United States Patent [19] [11] 3,961,287
Cacciola et al. [45] June 1, 1976

[54] AMPLITUDE MODULATED TRANSMITTER
[75] Inventors: John Cacciola, Ardsley; David W. Thomas, Lederach, both of Pa.
[73] Assignee: PRF, Inc., Lansdale, Pa.
[22] Filed: Apr. 16, 1975
[21] Appl. No.: 568,802

[52] U.S. Cl. .............................. 332/37 D; 332/16 T
[51] Int. Cl.² ............................................ H03C 1/06
[58] Field of Search ............. 332/37 D, 37 R, 16 T, 332/17, 18

[56] References Cited
UNITED STATES PATENTS

| | | | |
|---|---|---|---|
| 2,227,505 | 1/1941 | Kummerer | 332/37 D |
| 2,729,792 | 1/1956 | Castruccio | 332/37 R |
| 3,200,336 | 8/1965 | Valakos et al. | 332/37 R |
| 3,737,809 | 6/1973 | Parkyn | 332/37 R |
| 3,882,425 | 5/1975 | Briley | 332/37 D |

Primary Examiner—John Kominski
Attorney, Agent, or Firm—Steele & Petock

[57] ABSTRACT

An amplitude modulated transmitter is disclosed for use in the frequency range generally below 50 megahertz. The transmitter is provided with a series diode modulator which is provided with a corrected modulating signal which biases the diode in proportion to the modulating signal. The modulating signal is derived from comparison in a difference amplifier between the desired audio input signal and a signal derived from the output of the output amplifier by means of a directional coupler. The directional coupler samples the magnitude and phase of the current and voltage at the output and feeds a signal proportional to the inciden as contrasted to any reflected component, of the output signal.

7 Claims, 3 Drawing Figures

AMPLITUDE MODULATED TRANSMITTER

The purpose of the above abstract is to provide a nonlegal technical statement of the disclosure of the contents of the instant patent application and thus serve as a searching-scanning tool for scientists, engineers and researchers. Accordingly, this abstract is not intended to be used in understanding or otherwise comprehending the principles of the present invention hereinafter described in detail, nor is it intended to be used in interpreting or in any way limiting the scope or fair meaning of the claims appended hereto.

BACKGROUND OF THE INVENTION

The present invention relates to an amplitude modulated transmitter which employs a feedback loop which corrects for distortion. More particularly, the present invention relates to an amplitude modulated transmitter which uses a directional coupler in the feedback loop of a type which may be employed in the frequency range below 50 mega-hertz.

In the past, modulation had to be carried out in one of the last power amplifier stages in order to avoid excessive distortion while maintaining a high efficiency. This required a very large modulating signal which was usually applied to a vacuum tube modulator. Where low level modulation, that is, modulation at one of the early stages in the transmitter, was employed, all stages after the modulator had to employ relatively distortion-free amplifiers. This resulted in the use of amplifiers operated in class A mode or very close to class A. Amplifiers which are operated in class A mode are relatively inefficient, as contrasted to amplifiers which are operated in class C mode.

The present invention enables relatively distortion-free amplification of the modulated signal by monitoring the output of the transmitter, or the output of the output amplifier of the transmitter, even though there may be signals reflected from an antenna or other load which the transmitter is feeding. Examples of other loads may be additional amplification stages or the feeding of the output of the transmitter into a network such as the alternating current power system of a building.

SUMMARY OF THE INVENTION

The present invention provides an amplitude modulated transmitter which produces a modulated output signal with very little distortion in its modulation envelope.

The present invention provides a relatively distortion-free output by monitoring or feeding back to the modulation means a sample of the output signal. The present invention provides a means whereby the output of the transmitter may be accurately sampled, even though signals from the load may be reflected back to the output of the transmitter.

Briefly, in accordance with the present invention, an amplitude modulated transmitter is provided. Means are provided in the transmitter for providing a carrier frequency signal. Diode modulation means is connected in series with the output of the carrier frequency means for modulating the carrier frequency signal in response to a modulation signal for varying the bias of the diode modulation means. Amplifier means is provided. The amplifier means receives the modulated carrier frequency signal and amplifies the same to provide an amplified output signal. Directional coupler sampler means is connected to the output of the amplifier means. The directional coupler means includes a capacitor voltage coupling means, inductive current coupling means, and signal processing means for providing a sensed signal output proportional to the modulation output of the amplifier means. A difference amplifier is provided for producing a difference output signal between the audio frequency signal to be used to modulate the transmitter and the sensed output signal. The difference output signal is applied to the diode modulation means as the modulation signal whereby the amplitude modulated transmitter may be operated at high levels of efficiency with a minimum of distortion.

The directional coupler sampler means includes a capacitor voltage coupling means connected to the output of the amplifier means of the transmitter and provides a voltage proportional to the amplitude and phase of the voltage appearing at the output. The current coupling means is connected to the output of the amplifier means for providing a voltage proportional to the amplitude and phase of the current flow appearing at the output of the amplifier means. Signal processing means is provided whch includes a means for algebraically summing the output of said capacitor voltage coupling means and said inductive current coupling means and means for demodulating the signal output of the resistance network means.

BRIEF DESCRIPTION OF THE DRAWINGS

For the purpose of illustrating the invention, there are shown in the drawings forms which are presently preferred; it being understood, however, that this invention is not limited to the precise arrangements and instrumentalities shown.

DETAILED DESCRIPTION OF THE PREFERRED EMBODIMENTS

Figure 1:
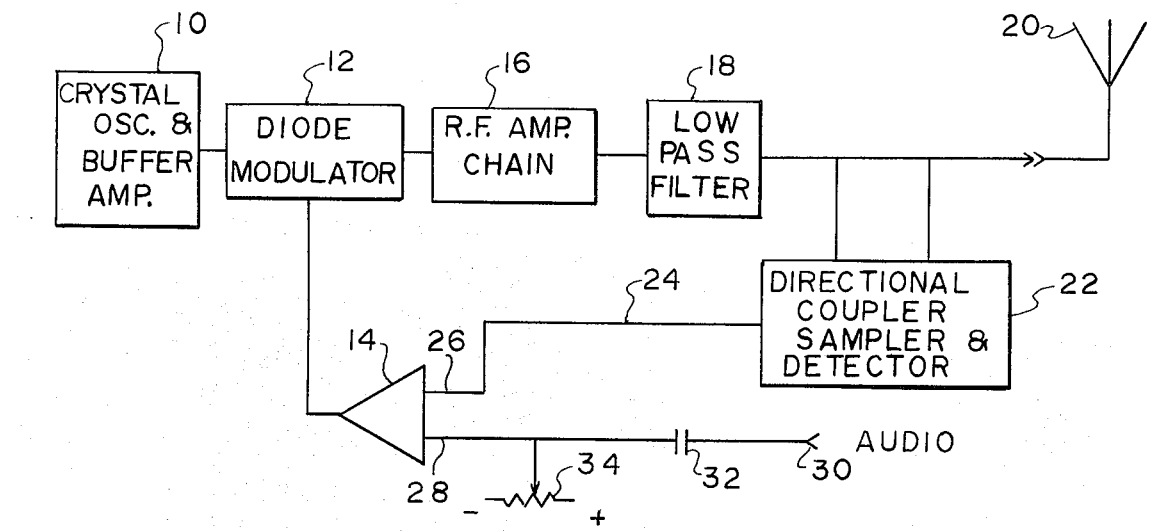
FIG. 1 is a block diagram of a preferred embodiment of an amplitude modulated transmitter in accordance with the present invention.

Referring now to the drawings, there is shown in FIG. 1 a simplified block diagram of an amplitude modulated transmitter in accordance with the present invention. A crystal oscillator and buffer amplifier 10 provides an unmodulated carrier frequency signal to diode modulator 12. The crystal oscillator and buffer amplifier may be a conventional Pierce crystal controlled FET oscillator. The buffer amplifier may be a conventional emitter follower amplifier. However, it is understood that other conventional oscillators and crystal oscillators may be used to generate the carrier frequency signal. It is also understood that other types of buffer amplifiers may be used.

Diode modulator 12 is preferably a diode connected in series with the carrier frequency signal. A modulation signal is provided to diode modulator 12 from difference amplifier or modulation amplifier 14. The signal provided by difference amplifier 14 varies the bias on the series connected diode to modulate the carrier frequency signal. The diode modulator effectively acts similar to a variable resistance varied in accordance with the modulation signal.

The output of diode modulator 12 is fed to a R.F. amplifier chain 16. Since the modulation precedes the R.F. amplification stages, this transmitter is considered to be a low level modulation transmitter. Low level modulation requires that all of the amplifiers in the amplifier chain be operated in a distortion-free mode. However, operation in a distortion-free mode, sometimes referred to in the art as class A operation, produces a relatively low efficiency of operation of the amplifier. With the use of the present invention, these amplifiers need not be operated Class A, and the transmitter is still able to produce a relatively distortion-free output modulated signal.

The output of R.F. amplifier chain 16 is fed through low pass filter 18 to the load which may be an antenna 20. Although an antenna is illustrated and is the usual load into which a transmitter would feed, it is understood that the present invention has application independent of the load into which it is feeding. For example, in certain cases, the transmitter may be feeding into additional amplifiers prior to applying it to an antenna. In other cases, the transmitter output may be fed into a transmission line system of some form. For example, it may be fed into the 60 cycle power distribution system of a building.

The output of low pass filter 18 is applied to directional coupler sampler and detector circuitry 22. The directional coupler sampler circuitry samples the incident power flow from the R.F. amplifier chain 16 through low pass filter 18 to antenna 20. The directional coupler sampler circuitry is insensitive to or eliminates the effects of reflected power flow back from antenna 20. This sampled signal is processed by detecting the modulation component of the modulated output of the R.F. amplifier chain 16. This signal is fed back via line 24 to input 26 of difference amplifier 14. Input 28 of difference amplifier 14 receives an audio input signal via input terminal 30 and capacitor 32. Input 28 of difference amplifier 14 also receives a level input from potentiometer 34 which sets the bias level for the modulation diode which in turn controls the unmodulated carrier level.

It may be seen that any error created in the R.F. amplification chain or at any other point between the modulator and the output of the transmitter is corrected by means of the closed loop system. Furthermore, the reflected signals back from the load or antenna do not affect the correction capabilities of the closed loop system due to the use of the directional coupler. The detected output of the directional coupler sampler is compared in difference amplifier 14 with the audio input modulation signal. The output of difference amplifier 14 controls diode modulator 12.

Figure 2:
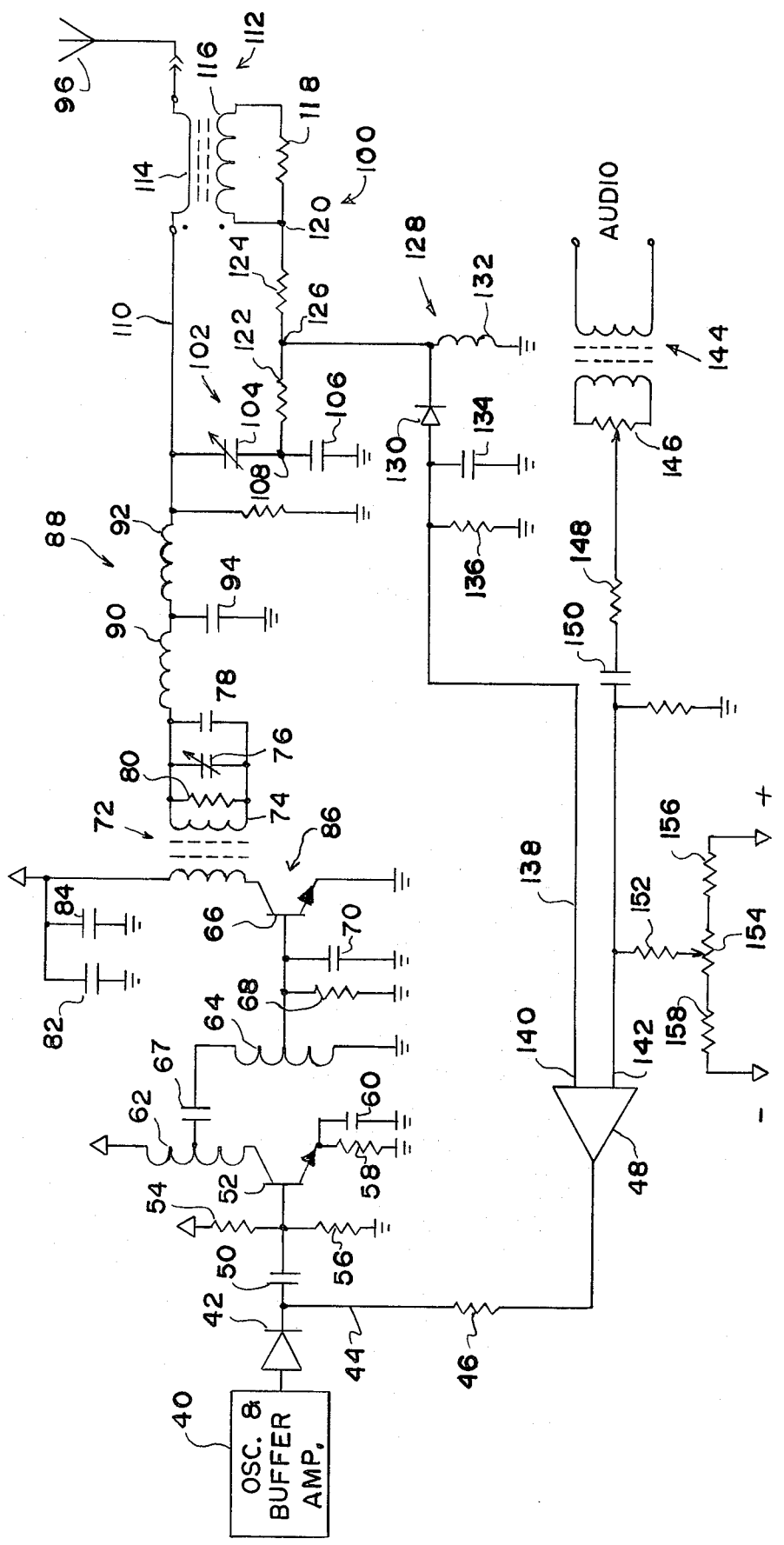
FIG. 2 is a schematic diagram, partially in block diagram form, of a preferred embodiment of the present invention.

Referring now to FIG. 2, there is shown a preferred embodiment of the present invention in great detail. Referring now to FIG. 2, there is shown oscillator and buffer amplifier circuitry 40 in block diagram form. As indicated above, this circuitry may be conventional and is not described here in detail. The output of the buffer amplifier is applied through series diode modulator 42. The modulation signal, including the level bias control signal, is applied to one side of diode modulator 42 via line 44 and resistor 46 from difference amplifier or modulation amplifier 48.

The output of diode modulator 42 is applied through coupling capacitor 50 to the base of transistor 52. Resistors 54 and 56 in conjunction with resistor 58 and capacitor 60 bias transistor 52 to operate in class AB mode of operation. The output of transistor 52 is applied through autotransformers 62 and 64 and coupling capacitor 67 to the base of transistor 66. Transistor 66 is the output R.F. amplifier and is biased through resistor 68, capacitor 70, and the lower portion of autotransformer 64 to operate in class C mode. Of course, the collector circuit components of both transistors 52 and 66 are taken into consideration in biasing. The output or collector circuit of transistor 66 is applied to iron core transformer 72. The secondary winding 74 of transformer 72 is tuned by means of capacitors 76 and 78. Resistor 80 provides a damping function. Capacitor 82 is an R.F. bypass capacitor. Capacitor 84 is an audio bypass capacitor. These provide filtering functions on the power supply line.

Transistor 66 and its associated circuitry comprises an R.F. amplifier means 86. The previous transistor amplifier 52 and the other associated circuitry may be considered a part of this R.F. amplifier means. The output of R.F. amplifier means 86 is fed through low pass filter 88 comprised of coils 90 and 92 and capacitor 94. The output of low pass filter 88 is applied to antenna 96.

Directional coupler sampler circuitry 100 selectively samples the modulated R.F. signal flowing from R.F. amplifier 86, through low pass filter 88, to antenna 96. Directional coupler sampling circuitry 100 discriminates against or does not sense power flow reflected back from antenna 96. As discussed previously, other loads may be substituted for antenna 96.

Directional coupler sampling circuit 100 is comprised of a capacitor voltage coupling means 102 comprised of variable capacitor 104 and capacitor 106. Capacitors 104 and 106 form a capacitive voltage divider. The voltage at point 108 is a capacitively coupled voltage which is proportional to the line voltage and phase. In other words, the phase of the voltage at point 108 would follow the phase of the voltage on line 110. The reactance of capacitors 104 and 106 is selected to be high with respect to the characteristic line impedance, but low with respect to the impedance of resistors 122 and 124. Capacitor 104 is used to balance the coupler to provide a zero output if all power flow is back from the antenna. Other types of voltage coupling may be used.

Inductive current coupling means is provided at 112. Inductive current coupling means 112 is comprised of an iron core transformer having a single turn primary winding 114 and a multiturn secondary 116. The phase relationship of the windings is shown by the conventional dot notation. It should be noted that other types of current coupling may be used. Resistor 118 is connected across secondary winding 116. The voltage at point 120 is proportional to the magnitude and phase of the current flowing in line 110. The voltages at points 108 and 120 are combined in a resistive network comprised of resistors 122 and 124. The output at point 126 is applied to a detector circuit 128 comprised of diode 130, coil 132, capacitor 134 and resistor 136. The output of the detector circuit is applied via line 138 to input 140 of difference amplifier 48.

Input 142 of difference amplifier 48 receives an audio input signal via transformer 144, potentiometer 146, resistor 148 and capacitor 150. Potentiometer 146 varies the magnitude of the audio applied to input 142 of difference amplifier 48. Input 142 of difference amplifier 48 is connected through resistor 152 to potentiometer 154. Potentiometer 154 is connected via resistors 156 and 158 across a positive and a negative supply voltage. The setting on potentiometer 154 controls the bias level for modulation diode 52 which sets the unmodulated carrier level of the transmitter.

In operation, the output of oscillator and buffer amplifier 40 is modulated in the diode 42 by applying the modulation signal from difference amplifier 48 to one side of diode 42. The output of diode modulator 42 is amplified by means of amplifier means 86 comprised of transistors 52 and 66 and associated circuitry. The output of amplifier means 86 is applied through low pass filter 88 to antenna 96. Directional coupler sampler circuitry 100 detects the component of the modulated signal flowing from amplifier means 86 to antenna 96. This component of the signal is detected in detector circuitry 128 and applied to input 140 of difference amplifier 48. Input 142 of difference amplifier 48 receives an audio signal and a bias level input. The difference signal output of amplifier 48 is applied as the modulation signal to diode 42. This modulation signal is constantly corrected by the feedback loop and is responsive only to the output signal of the transmitter. The feedback loop does not create errors or become inoperative because of signals being reflected back from the antenna or other load.

Figure 3:
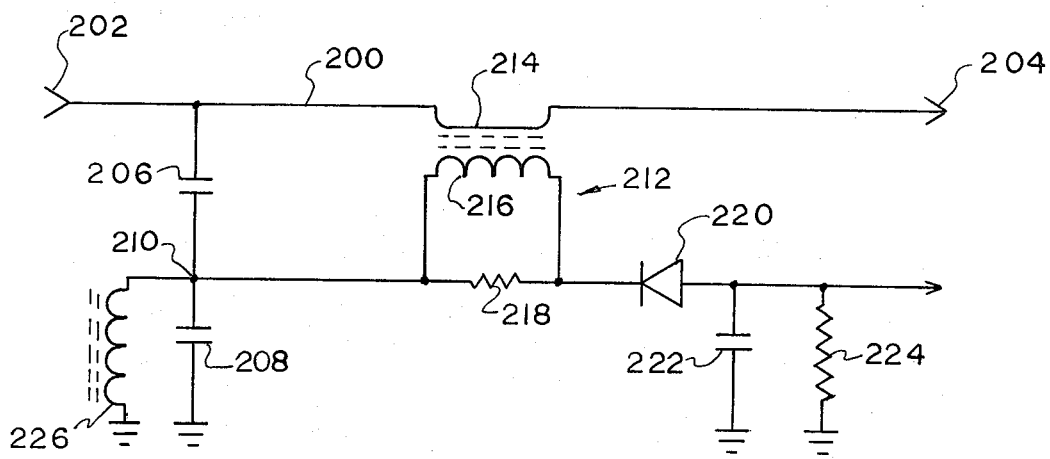
FIG. 3 is an alternate embodiment of a directional coupler which may be used in the present invention.

Referring now to FIG. 3, there is shown an alternate embodiment of a directional coupler which may be used in the present invention. There is shown in FIG. 3 a line 200 which receives an amplitude modulated signal at its input terminal 202 and supplies the amplitude modulated signal to an antenna via its output terminal 204. Capacitors 206 and 208 form a capacitive voltage coupling network. A voltage proportional to the amplitude and phase of the voltage on line 200 appears at point 210.

An inductive current coupling means is shown at 212 which is comprised of a transformer having a single turn primary winding 214 and a multi-turn secondary winding 216. The polarity of the windings is shown by the conventional dot notation. Resistor 218 is connected across secondary winding 216.

The voltage appearing at point 210 and the voltage developed across resistor 218 are algebraically added in the series circuit and detected by means of the detector comprised of diode 220, capacitor 222, resistor 224, and coil 226 which functions as a DC ground return path for the detector circuit.

It will be apparent to those skilled in the art that various modifications and changes may be made to the circuitry disclosed herein within the scope and spirit of the teachings of the present invention. For example, various modifications and changes may be made to the amplifier circuitry disclosed herein. Numerous other types of filtering circuits may be used. Means other than capacitors may be used for the voltage coupling means to produce a voltage proportional to the amplitude and phase of the line voltage in the directional coupler. Similarly, means other than the inductive coupling arrangement disclosed herein may be used to obtain a voltage proportional to the magnitude and phase of the line current. Modifications may also be made to the circuitry of the directional coupler, one example being that disclosed in FIG. 3.

In view of the above, the present invention may be embodied in other specific forms without departing from the spirit or essential attributes thereof and, accordingly, reference should be made to the appended claims, rather than to the foregoing specification as indicating the scope of the invention.

We claim:
1. An amplitude modulated transmitter, comprising:
 means for providing a carrier frequency signal at an output;
 diode modulation means connected in series with the output of said carrier frequency means for modulating the carrier frequency signal in response to a modulation signal which varies the bias of said diode modulation means;
 amplifier means, said amplifier means receiving the modulated carrier frequency signal and amplifying the same to provide an amplified output signal;
 directional coupler sampler means connected to the output of said amplifier means, said directional coupler means including voltage coupling means, current coupling means, and signal processing means responsive to said voltage and current coupling means for providing a sensed output signal proportional to the modulation output of said amplifier means;
 an audio frequency signal input means for providing an audio frequency signal; and
 difference amplifier means, said difference amplifier means being provided with a first and a second input, said first input receiving said sensed output signal and said second input receiving said audio frequency signal, said difference amplifier means producing a difference output signal which is applied to said diode modulation means as the modulation signal whereby the amplitude modulated transmitter may be operated at high levels of efficiency with a minimum of distortion.

2. An amplitude modulated transmitter in accordance with claim 1 wherein the output of said amplifier means is coupled to an antenna.

3. An amplitude modulated transmitter in accordance with claim 1 wherein sad directional coupler sampler means includes a capacitor voltage coupling means connected to the output of said amplifier means and providing a voltage proportional to the amplitude and phase of the voltage appearing at the output of said amplifier means and an inductive current coupling means connected to the output of said amplifier means for providing a voltage proportional to the amplitude and phase of the current flow appearing at the output of the amplifier means and said signal processing means includes means for algebraically summing the outputs of said capacitor voltage coupling means and said inductive current coupling means and means for demodulating the signal output of algebraic summing.

4. An amplitude modulated transmitter in accordance with claim 1 wherein said second input of said difference amplifier means also receives a DC level input signal for controlling the carrier level output of the transmitter.

5. An amplitude modulated transmitter in accordance with claim 3 wherein said inductive current coupling means includes a current transformer having a single turn primary winding connected in series with the output of said amplifier means and a secondary having a plurality of turns.

6. Amplitude modulated transmitter means in accordance with claim 3 wherein said capacitor voltage coupling means includes a capacitor voltage divider network.

7. Amplitude modulated transmitter means in accordance with claim 3 wherein said signal processing means includes resistance network means for algebraically summing the outputs of said capacitor voltage coupling means and said inductive current coupling means.

* * * * *